(12) United States Patent
Cheng et al.

(10) Patent No.: US 8,143,623 B2
(45) Date of Patent: Mar. 27, 2012

(54) THIN FILM TRANSISTOR AND MANUFACTURING METHOD THEREOF

(75) Inventors: Huang-Chung Cheng, Hsinchu (TW);
Ta-Chuan Liao, Taichung (TW);
Sheng-Kai Chen, Taipei County (TW);
Ying-Hui Chen, Taoyuan County (TW);
Chi-Neng Mo, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 184 days.

(21) Appl. No.: 12/686,357

(22) Filed: Jan. 12, 2010

(65) Prior Publication Data

US 2011/0084283 A1    Apr. 14, 2011

(30) Foreign Application Priority Data

Oct. 8, 2009 (TW) .............................. 98134191 A

(51) Int. Cl.
*H01L 29/786* (2006.01)
*H01L 21/336* (2006.01)
(52) U.S. Cl. ... 257/66; 257/324; 257/347; 257/E21.412; 257/E29.292; 438/151
(58) Field of Classification Search .............. 257/66, 257/324–347, E21.412, E29.292; 438/151
See application file for complete search history.

(56) References Cited

U.S. PATENT DOCUMENTS

2007/0215929 A1* 9/2007 Yasuda ......................... 257/314
2009/0040829 A1* 2/2009 Lue ........................... 365/185.13

OTHER PUBLICATIONS

Chen et al., "Nonvolatile polycrystalline silicon thin-film-transistor memory with oxide/nitride/oxide stack gate dielectrics and nanowire channels," Applied Physics Letters 90, 122111, 2007.
Hsieh et al., "MONOS Memory in Sequential Laterally Solidified Low-Temperature Poly-Si TFTs," IEEE Electron Device Letters, vol. 27, No. 4, Apr. 2006, pp. 272-274.

* cited by examiner

*Primary Examiner* — Cuong Q Nguyen
*Assistant Examiner* — Cathy N Lam
(74) *Attorney, Agent, or Firm* — Jianq Chyun IP Office

(57) ABSTRACT

A thin film transistor and a manufacturing method thereof are provided. An insulating pattern layer having at least one protrusion is formed on a substrate. Afterwards, at least one spacer and a plurality of amorphous semiconductor patterns separated from each other are formed on the insulating pattern layer. The spacer is formed at one side of the protrusion and connected between the amorphous semiconductor patterns. Later, the spacer and the amorphous semiconductor patterns are crystallized. Subsequently, the protrusion and the insulating pattern layer below the spacer are removed so that a beam structure having a plurality of corners is formed and suspended over the substrate. Then, a carrier tunneling layer, a carrier trapping layer and a carrier blocking layer are sequentially formed to compliantly wrap the corners of the beam structure. Hereafter, a gate is formed on the substrate to cover the beam structure and wrap the carrier blocking layer.

7 Claims, 11 Drawing Sheets

THIN FILM TRANSISTOR AND MANUFACTURING METHOD THEREOF

CROSS-REFERENCE TO RELATED APPLICATION

This application claims the priority benefit of Taiwan application serial no. 98134191, filed on Oct. 8, 2009. The entirety of the above-mentioned patent application is hereby incorporated by reference herein and made a part of specification.

BACKGROUND OF THE INVENTION

1. Field of the Invention

The present invention generally relates to a semiconductor device, and more particularly, to a thin film transistor (TFT).

2. Description of Related Art

FIG. 1 shows a schematic cross-sectional view of a conventional thin film transistor. As shown in FIG. 1, a thin film transistor 100 comprises a substrate 110, an insulating layer 120, an island polysilicon 140, a carrier tunneling layer 152, a carrier trapping layer 154, a carrier blocking layer 156 and a gate 160. The insulating layer 120, the island polysilicon layer 140, the carrier tunneling layer 152, the carrier trapping layer 154, the carrier blocking layer 156 and the gate 160 are sequentially disposed over the substrate 110.

In the island polysilicon 140, two N-type doped regions are used as a source 140a and a drain 140b and a region between the source 140a and the drain 140b is used as a channel 140c. Moreover, each of the source 140a, the drain 140b and the channel 140c has a peak structure P and the peak structures P are formed by the sequential lateral solidification (SLS) laser crystallization with complex process procedures.

As for the nonvolatile memory constructed by the thin film transistors 100, these peak structures P can be used to enhance the strength of the electric field so as to improve the efficiency of the program operation and erase operation. However, by using the sequential lateral solidification laser crystallization, there are problems such as uncontrollable height of the peak structure P and inaccurate alignment between the peak structure P and other film layers. Therefore, the uniformity of the electrical performances of the thin film transistors 100 is poor and the efficiency of the program operation and the erase operation of the nonvolatile memory is decreased so as to decrease the yield of the thin film transistor 100.

SUMMARY OF THE INVENTION

The invention provides a method for manufacturing a thin film transistor capable of simplifying the manufacturing process, increasing the yield and decreasing the cost.

The invention provides a thin film transistor having relatively uniform electrical performance.

The invention provides a method for manufacturing a thin film transistor. The method includes the following steps. First, an insulating pattern layer is formed on a substrate, wherein the insulating pattern layer has at least a protrusion. Then, at least a spacer and a plurality of amorphous semiconductor patterns separated from each other are formed on the insulating pattern layer, wherein the spacer is formed at a side of the protrusion and connected between the amorphous semiconductor patterns. The spacer and the amorphous semiconductor patterns are crystallized. Thereafter, the protrusion and the insulating pattern layer under the spacer are removed so that the spacer is suspended over the substrate as a beam structure having a plurality of corners; Then, a carrier tunneling layer, a carrier trapping layer and a carrier blocking layer are sequentially formed over the substrate, wherein the carrier tunneling layer, the carrier trapping layer and the carrier blocking layer sequentially compliantly wrap the corners of the beam structure. Later, a gate is formed over the substrate, wherein the gate covers the beam structure and wraps the carrier blocking layer.

According to one embodiment of the present invention, the protrusion is a rectangular parallelepiped and the side of the protrusion is a long side of the rectangular parallelepiped. According to one embodiment, the amorphous semiconductor patterns cover two opposite short sides of the rectangular parallelepiped respectively.

According to one embodiment of the present invention, the method for manufacturing the thin film transistor further comprises the following steps. First, the amorphous semiconductor patterns are converted into a plurality of poly-semiconductor patterns after the amorphous semiconductor patterns are crystallized. Then, an ion implantation is performed on the poly-semiconductor patterns respectively connected to two ends of the beam structure so as to respectively form a source and a drain, wherein the beam structure is connected between the source and the drain.

According to one embodiment of the present invention, the material of the amorphous semiconductor patterns includes amorphous silicon, amorphous germanium or amorphous silicon germanium.

According to one embodiment of the present invention, the material of the spacer before the spacer is crystallized includes amorphous silicon, amorphous germanium or amorphous silicon germanium.

The present invention provides a thin film transistor comprising a substrate, an insulating pattern layer, a plurality poly-semiconductor patterns, at least a beam structure, a carrier tunneling layer, a carrier trapping layer, a carrier blocking layer and a gate. The insulating pattern layer is disposed over the substrate and the poly-semiconductor patterns are disposed on the insulating pattern layer and separated from each other. The beam structure is suspended over the substrate without being directly in contact with the substrate and is connected between the poly-semiconductor patterns and having a plurality of corners. The carrier tunneling layer compliantly wraps the corners of the beam structure and the carrier trapping layer compliantly wraps the carrier tunneling layer and the carrier blocking layer compliantly wraps the carrier trapping layer. The gate is disposed over the substrate to cover the beam structure and wrap the carrier blocking layer.

According to one embodiment of the present invention, the thin film transistor further includes a source and a drain. The source and the drain are respectively formed in the poly-semiconductor patterns respectively connected to two ends of the beam structure, wherein the beam structure is connected between the source and the drain.

According to one embodiment of the present invention, the material of the poly-semiconductor patterns includes polysilicon, poly-germanium or poly-silicon germanium.

According to one embodiment of the present invention, the material of the beam structure includes polysilicon, poly-germanium or poly-silicon germanium.

According to one embodiment of the present invention, the beam structure has three corners.

According to one embodiment of the present invention, the material of the insulating pattern layer includes semiconductor oxide or semiconductor nitride.

According to one embodiment of the present invention, the material of the gate includes metal or semiconductor.

According to the aforementioned description, the thin film transistor of the present invention possesses uniform electrical performance and the method for manufacturing the thin film transistor of the present invention is capable of simplifying the manufacturing process, increasing the yield and decreasing the cost.

In order to make the aforementioned and other features and advantages of the application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

FIGS. 2A through 6A are top views showing a method for manufacturing a thin film transistor according to one embodiment of the invention.

FIGS. 2B through 6B are cross-sectional schematic views along line L-L on FIGS. 2A through 6A, respectively.

DESCRIPTION OF EMBODIMENTS

FIGS. 2A through 6A are top views showing a method for manufacturing a thin film transistor according to one embodiment of the invention and FIGS. 2B through 6B are cross-sectional schematic views along line L-L on FIGS. 2A through 6A, respectively.

Figure 1:
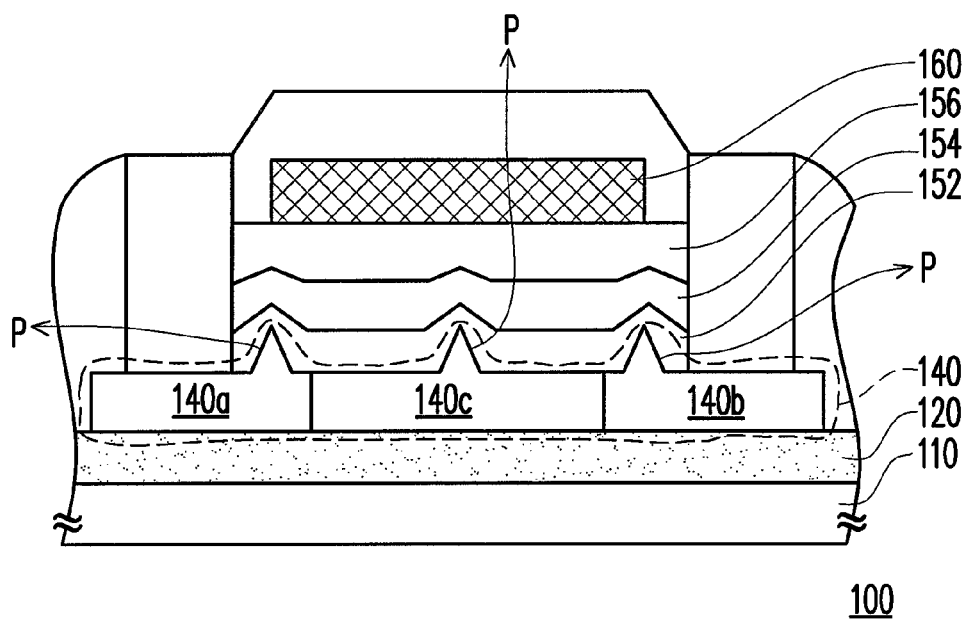
FIG. 1 shows a schematic cross-sectional view of a conventional thin film transistor.
Figure 2A:
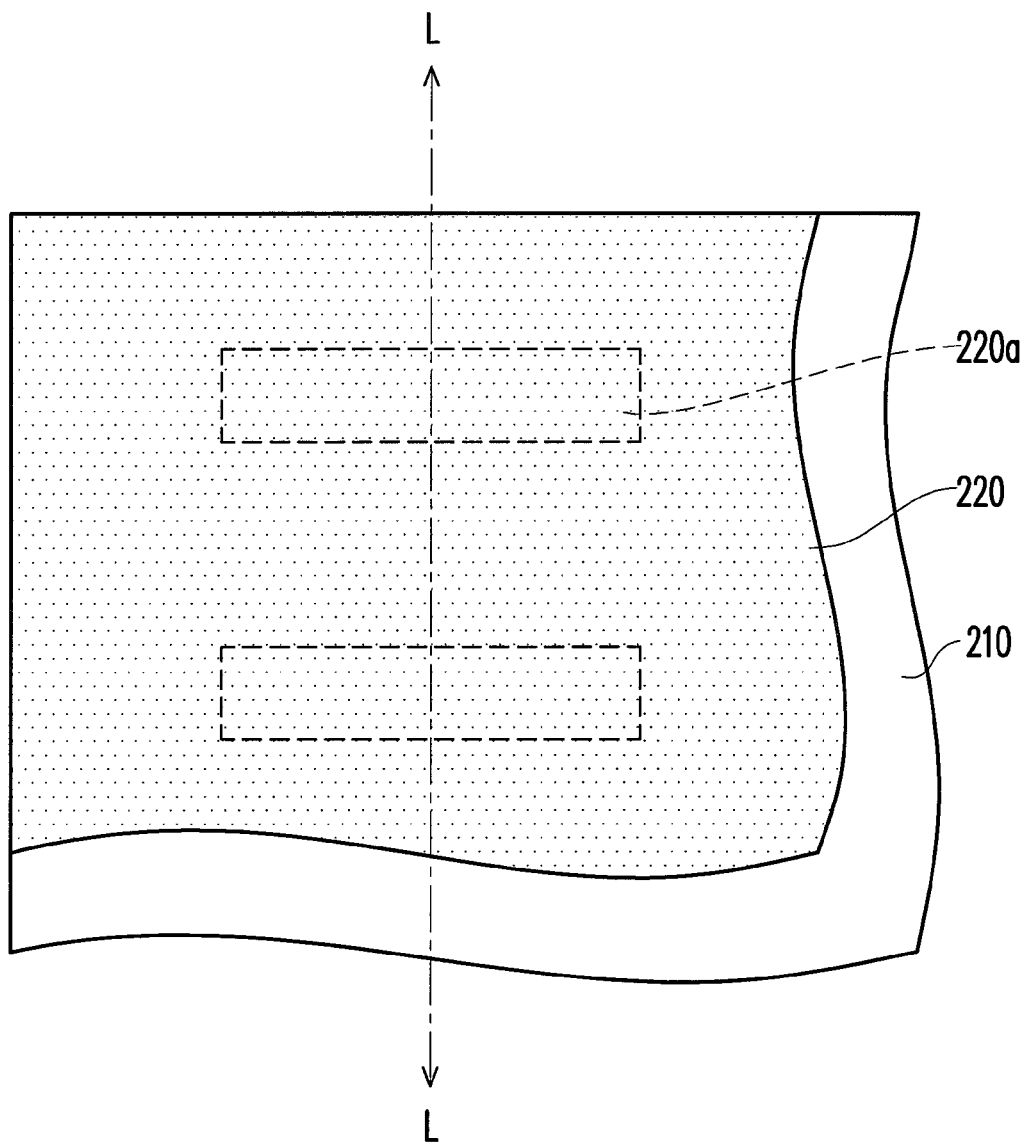
Figure 2B:
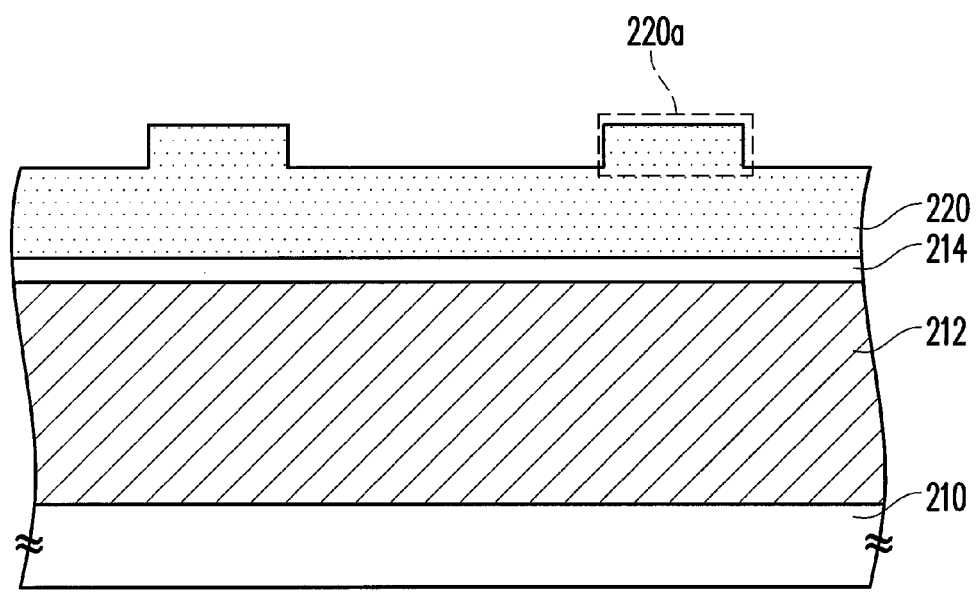

As shown in FIG. 2A and FIG. 2B, an insulating pattern layer 220 is formed over a substrate 210 and the insulating pattern layer 220 has at least one protrusion 220a. In the present embodiment, the insulating pattern layer 220 having two protrusions 220a is taking as an example but not used to limit the present invention. In the present embodiment, the shape of the protrusion 220a can be, for example but not limited to, a rectangular parallelepiped. By referring to FIG. 2A, it is clear that the top view profile (i.e. the top surface of the rectangular parallelepiped) of the protrusion 220a is approximated to a rectangle. Further, by referring to FIG. 2B, the cross-sectional view of the protrusion 220a is shown. In other words, the profile of the protrusion 220a of the present embodiment looks like a step profile.

In the present embodiment, the material of the substrate 210 can be, for example, glass and a nitride layer 214 can be, for example, disposed between the substrate 210 and the insulating pattern layer 220. Furthermore, the insulating pattern layer 220 having the protrusion 220a of the present embodiment is formed by using photolithography and etching process (PEP), wherein the etching can be, for example, the dry etching process and the material of the insulating pattern layer 220 comprises semiconductor oxide (e.g. silicon oxide), semiconductor nitride or other suitable insulating material. Practically, before the insulating pattern layer 220 is formed over the substrate 210, a layer of oxide material can be formed over the substrate 210 as a buffer layer 212. That is, the buffer layer 212 is formed between the substrate 210 and the insulating pattern layer 220.

Figure 3A:
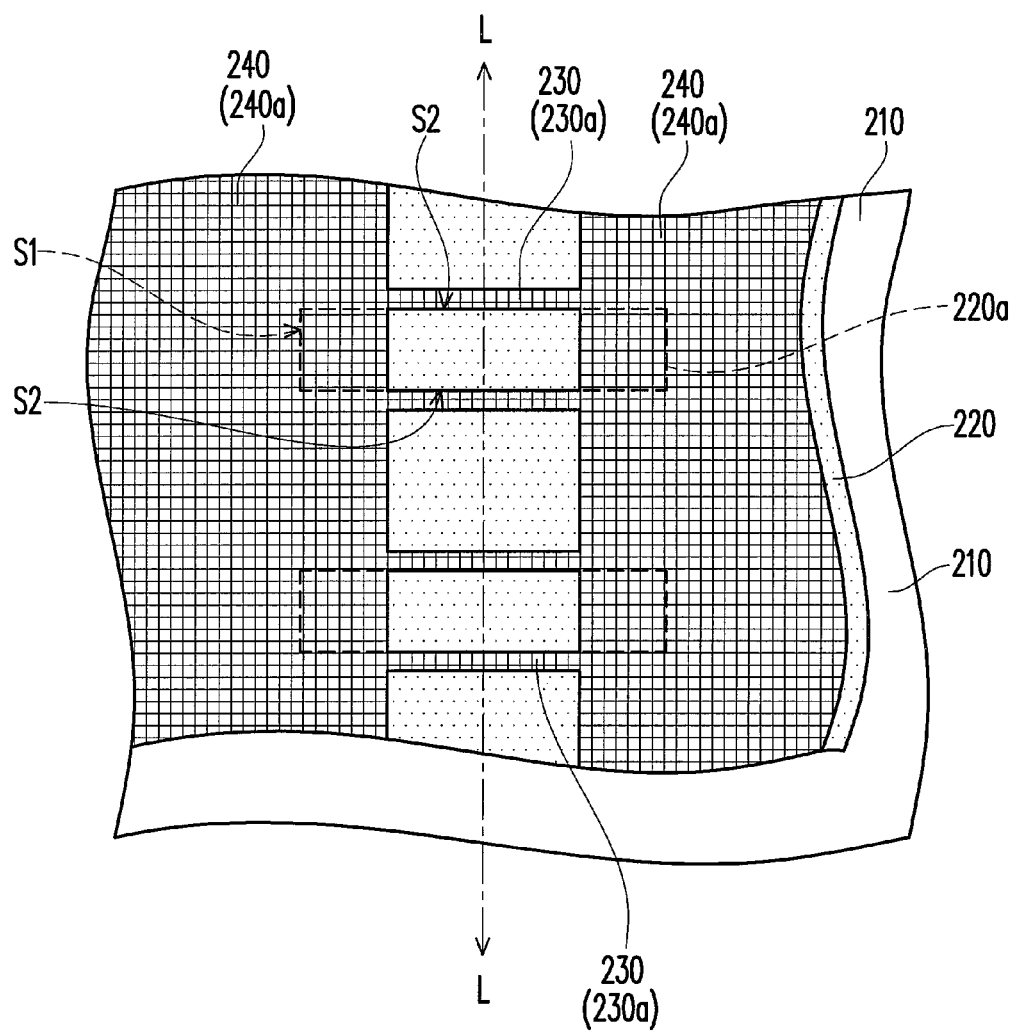
Figure 3B:
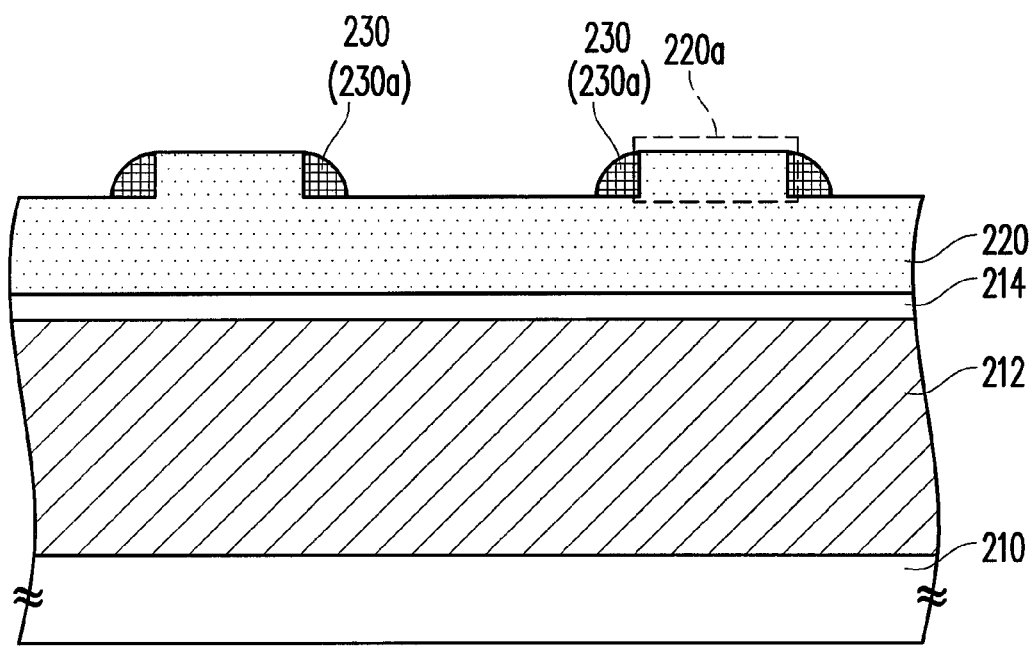

Then, as shown in FIG. 3A and FIG. 3B, at least a spacer 230 and a plurality of amorphous semiconductor patterns 240 separated from each other are formed on the insulating pattern layer 220, wherein the spacer 230 is connected between the amorphous semiconductor patterns 240. In the present embodiment, the spacer 230 and the amorphous semiconductor patterns 240 can be, for example, by entirely depositing a layer of thin film made of amorphous silicon, amorphous germanium, amorphous silicon germanium or other suitable amorphous semiconductor material on the insulating pattern layer 220 and then performing the PEP to form the patterns of the spacer 230 and the amorphous semiconductor patterns 240. The spacer 230 can be formed by using anisotropic etching process.

In the present embodiment, for example, four spacers 230 and two amorphous semiconductor patterns 240 are formed. In other words, as for the protrusion 220a of the rectangular parallelepiped, these amorphous semiconductor patterns 240 separated from each other cover the one pair of opposite sides of the protrusion 220a, such as the two opposite short sides S1 of the protrusion 220a. Alternatively, the spacers 230 are formed at another pair of opposite sides of the protrusion 220a, such as the two opposite long sides S2 of the protrusion 220a.

It should be noticed that, in the present embodiment, the insulating pattern layer 220 with two protrusions 220a are used to explain the present invention and it is assumed the spacers 230 are formed at the two opposite long sides S2 of each of the protrusions 220a. Therefore, the number of the spacers 230 drawn in FIG. 3A and FIG. 3B is four. However, the present invention is not limited by that the spacers should be formed at both of the opposite sides of the protrusion 220a. That is, the spacer(s) 230 can be only formed at one side of the protrusion 220a.

Then, the spacers 230 and the amorphous semiconductor patterns 240 are crystallized to be converted to spacers 230a and poly-semiconductor patterns 240a (shown in FIG. 3A and FIG. 3B) made of polysilicon, poly germanium, poly silicon germanium or other poly semiconductor material. Since the patterns before the crystallization process is similar to the patterns after the crystallization process, the spacers 230, 230a, the amorphous semiconductor patterns 240 and poly-semiconductor patterns 240a are together drawn in FIG. 3A and FIG. 3B to simplify the description.

Figure 4A:
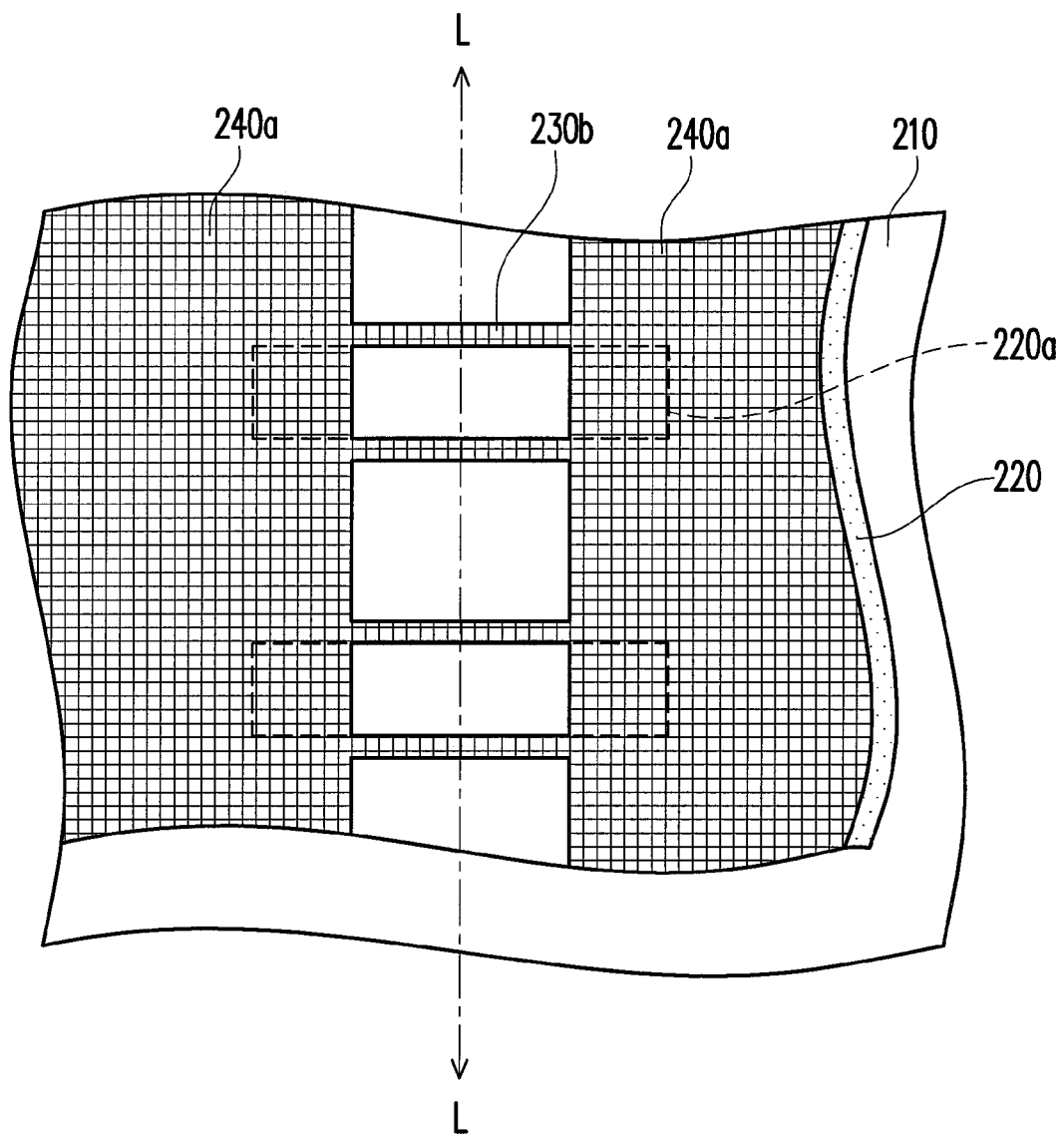
Figure 4B:
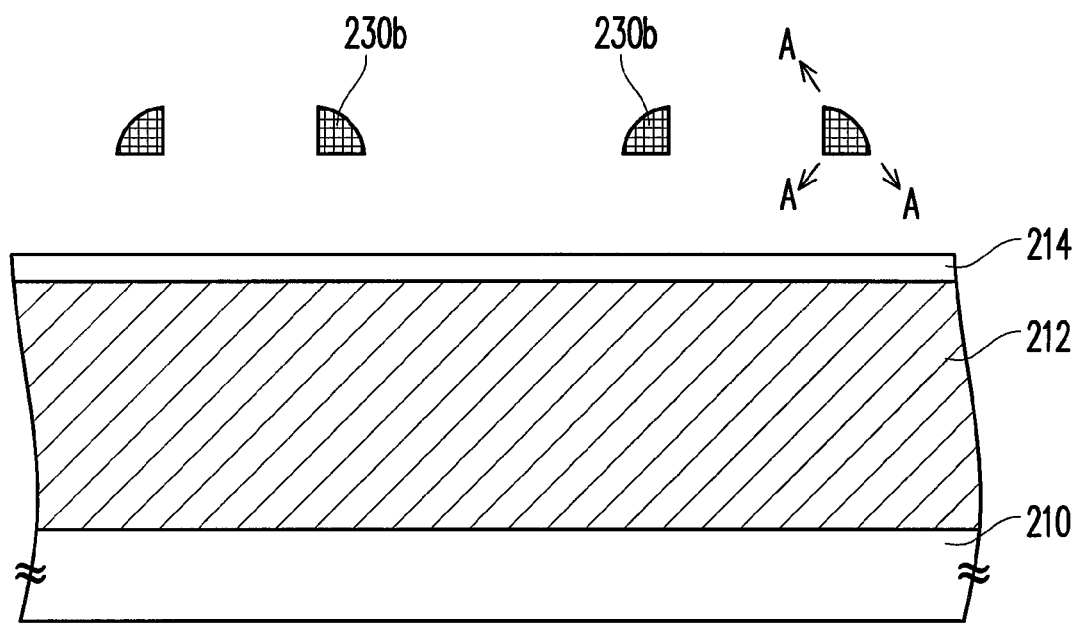

Thereafter, the protrusions 220a and the insulating pattern layer 220 under the spacers 230a are removed, wherein the removal of the protrusions 220a and the insulating pattern layer 220 under the spacers 230a can be performed by using the wet etching process. Therefore, the protrusions 220a and a portion of the insulating pattern layer 220 which are in contact with the protrusions 220a are removed to form a beam structure 230b (as shown in FIG. 4A and FIG. 4B) having a plurality of corners and suspended over the substrate 210. In the present embodiment, the beam structure 230b includes three corners A.

It should be noticed that, as shown in FIG. 4A, in the aforementioned step for removing the protrusions 220a, since the partial protrusions 220a of the present embodiment are covered by the poly-semiconductor patterns 240a, the actually removed portions are the protrusions 220a which are not covered by the poly-semiconductor patterns 240a. On the contrary, the protrusions 220a covered by the poly-semiconductor patterns 240a remain.

Figure 5A:
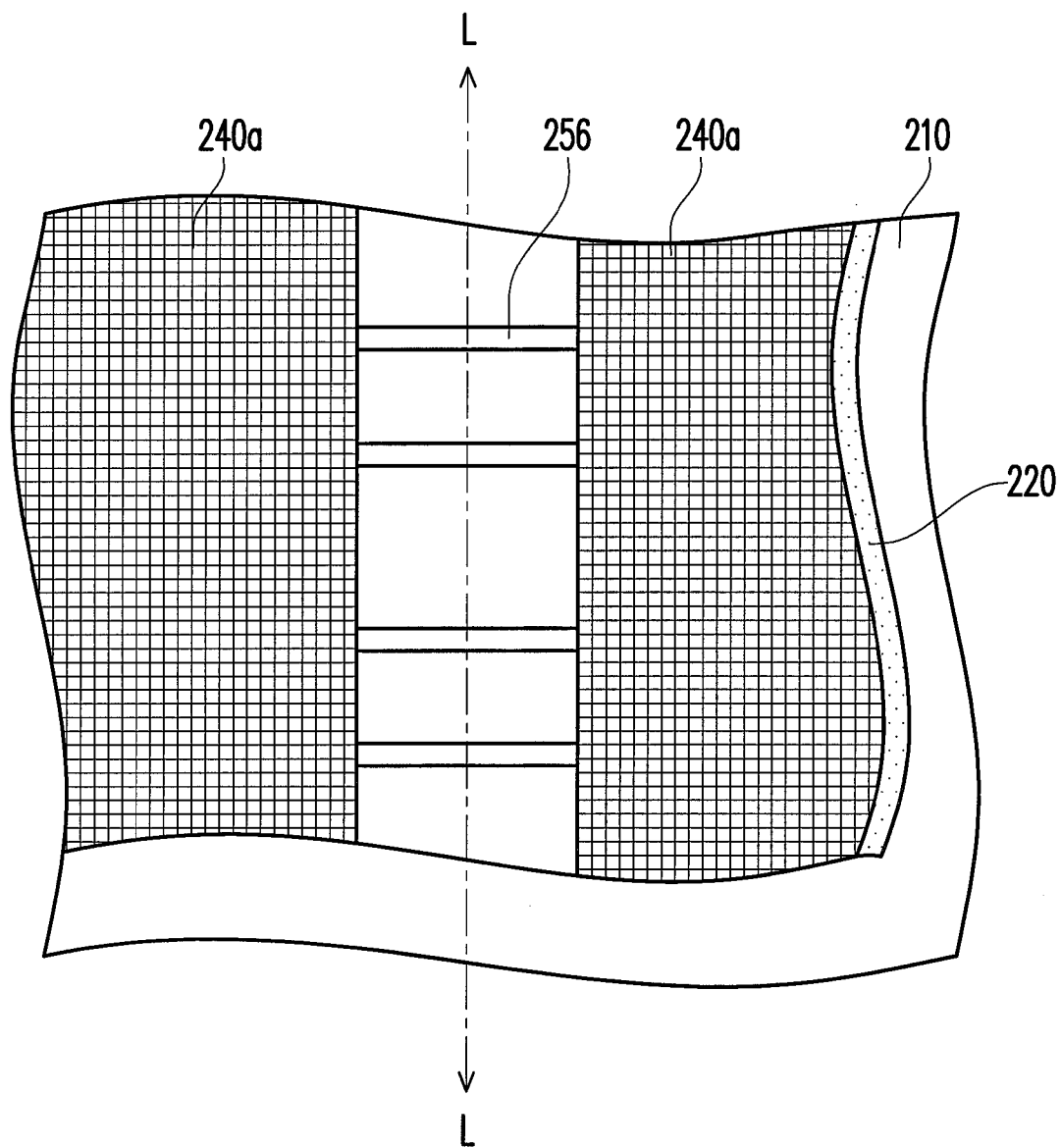
Figure 5B:
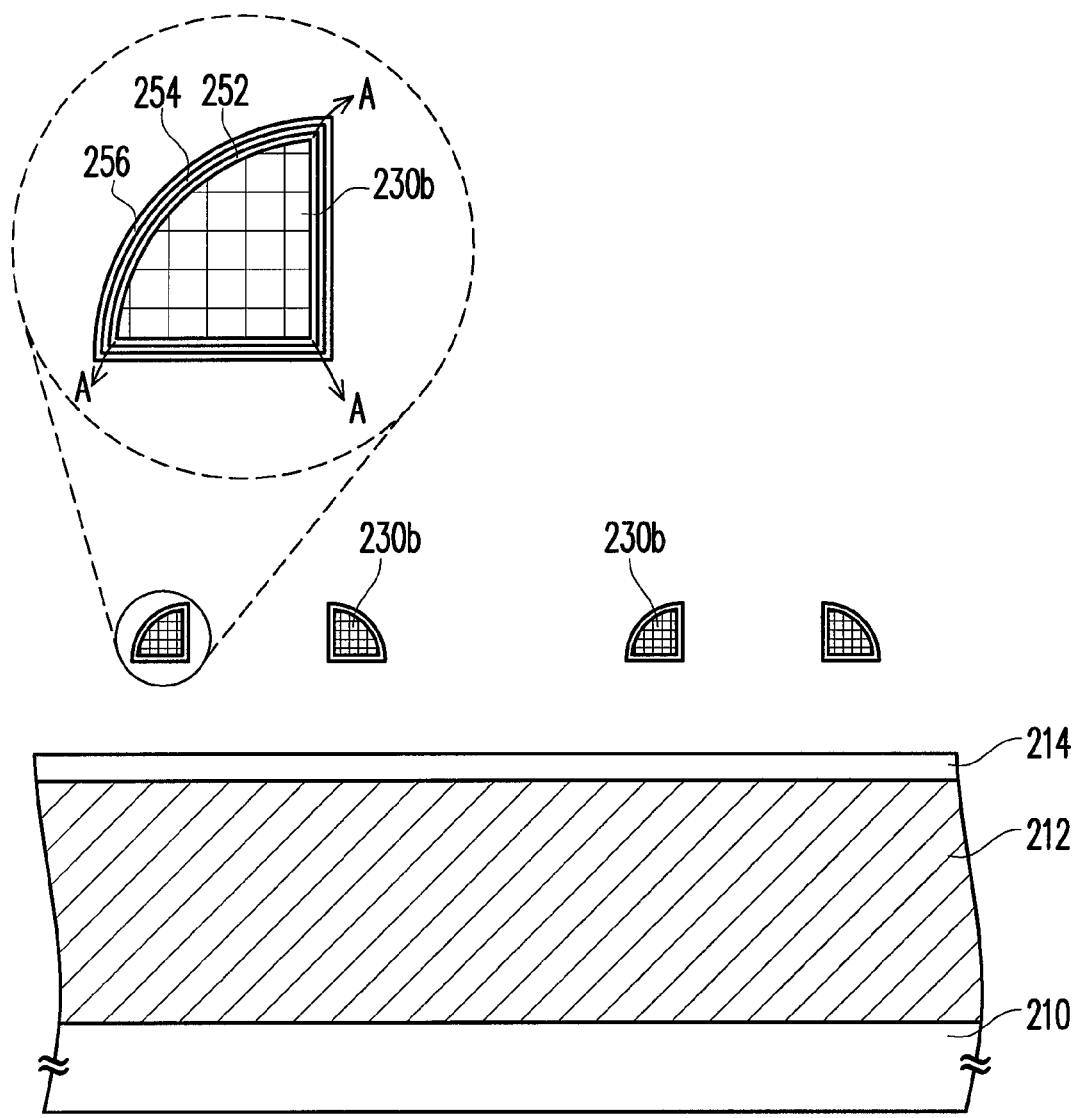

Then, as shown in FIG. 5A and FIG. 5B, a carrier tunneling layer 252, a carrier trapping layer 254 and a carrier blocking layer 256 are sequentially formed over the substrate 210. More clearly, in the present embodiment, the carrier tunneling layer 252, the carrier trapping layer 254 and the carrier blocking layer 256 are sequentially formed by isotropic depositing the silicon dioxide, the silicon nitride and the silicon dioxide so that the carrier tunneling layer 252, the carrier trapping layer 254 and the carrier blocking layer 256 are sequentially formed to wrap the corners A of the beam structure 230b and further to wrap the whole bean structure 230b.

It should be noticed that, in the present embodiment, the carrier tunneling layer 252, the carrier trapping layer 254 and the carrier blocking layer 256 compliantly wrap the bean structure 230b through the corners A and are not flatly formed over the substrate 210. Comparing with the carrier tunneling layer, the carrier trapping layer and the carrier blocking layer of the conventional thin film transistor, the present embodiment not only overcomes the electrical problems of the conventional thin film transistor but also improves the electrical performance of the conventional thin film transistor.

It should be noticed that, in the present embodiment, the beam structure 230b with corners A is formed by performing the PEP and the carrier tunneling layer 252, the carrier trapping layer 254 and the carrier blocking layer 256 compliantly wrap the bean structure 230b. Comparing with the conventional method using the sequential lateral solidification laser crystallization with complex process procedures to manufacture the peak structures P of the thin film transistor 100 disclosed in the prior art technology, the present embodiment provides the method with relatively simple process procedure and relatively low cost and can prevent from inducing the unexpected problems such as uncontrollable height of the peak structure P and position shifting of the peak structure P due to the sequential lateral solidification laser crystallization.

Figure 6A:
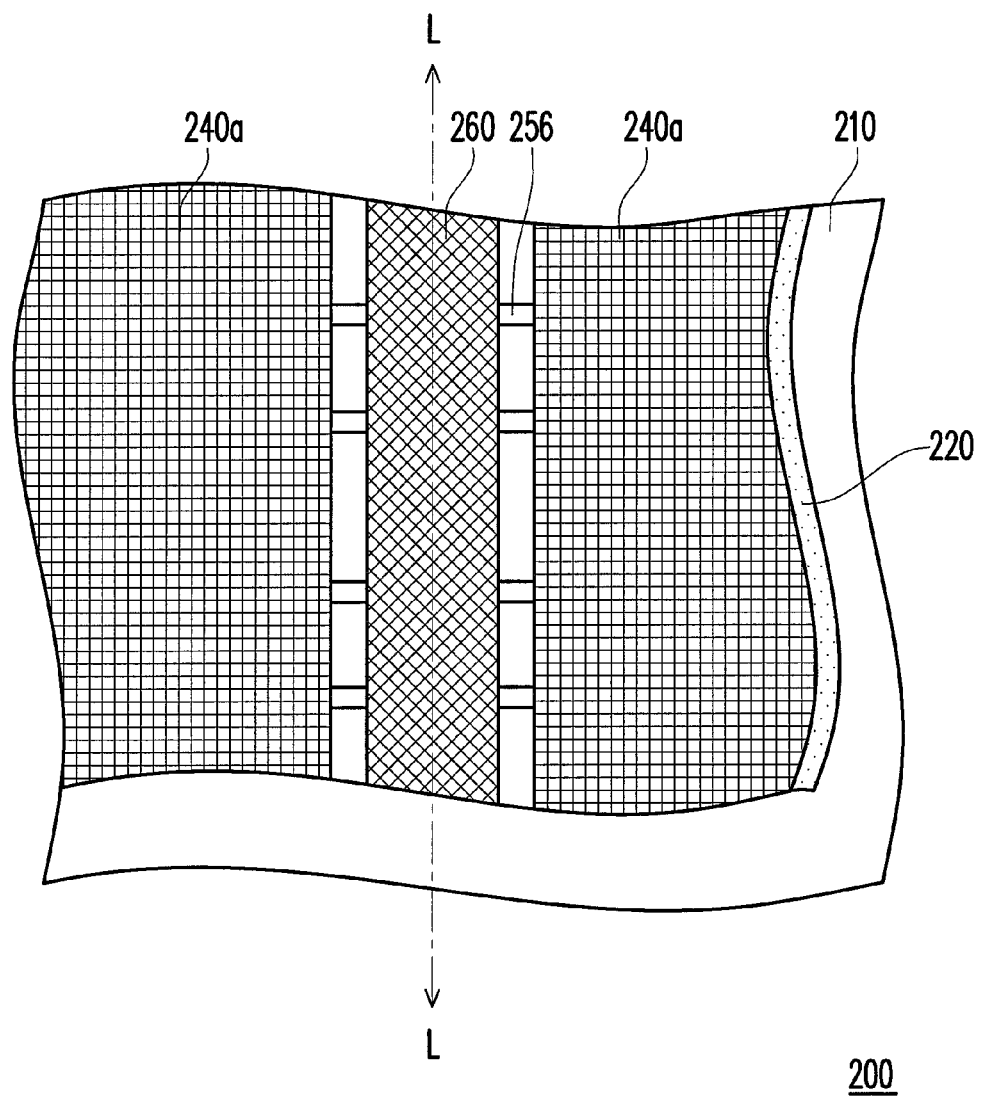
Figure 6B:
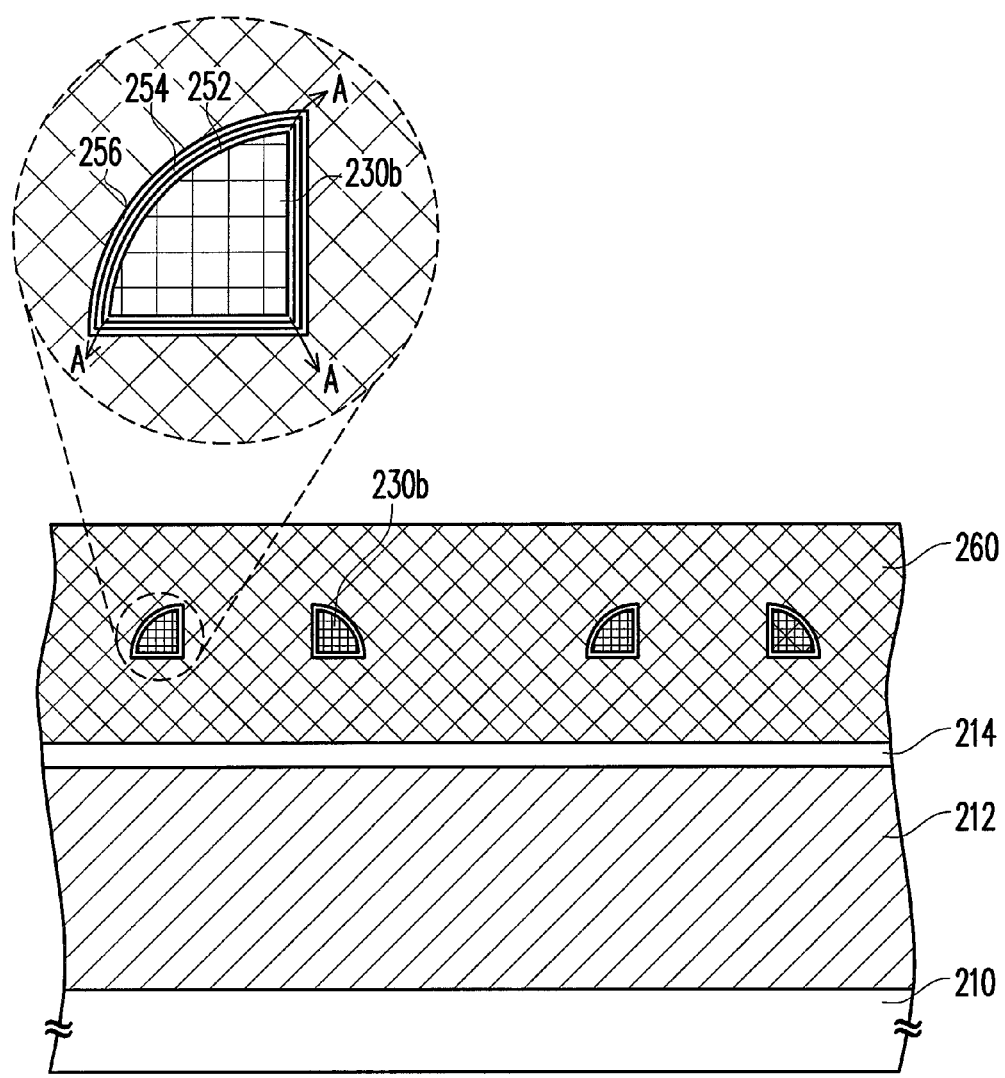

Thereafter, as shown in FIG. 6A and FIG. 6B, a gate 260 is formed on the substrate 210. In the present embodiment, the method for forming the gate 260 comprises forming a metal layer (not shown) or a semiconductor layer (not shown) over the substrate 210 to cover the beam structure 230b and then performing the PEP and the dry etching process to pattern the metal layer or semiconductor layer to form the gate 260 covering the beam structure 230b and the carrier blocking layer 256. Herein, the manufacturing of the thin film transistor 200 of the present embodiment is so far completed.

Moreover, in the present embodiment, before the gate 260 is formed, an ion implantation can be performed on the poly-semiconductor patterns 240a, which are respectively connected to two ends of the beam structure 230b (as shown in FIG. 4A), so as to respectively form a source and a drain. Therefore, the beam structure 230b is connected between the source and the drain.

As shown in FIG. 6A and FIG. 6B, a thin film transistor 200 of the present embodiment comprises a substrate 210, an insulating pattern layer 220, a plurality poly-semiconductor patterns 240a, at least a beam structure 230b, a carrier tunneling layer 252, a carrier trapping layer 254, a carrier blocking layer 256 and a gate 260. The insulating pattern layer 220 is disposed over the substrate 210 and the poly-semiconductor patterns 240a are disposed on the insulating pattern layer 220 and separated from each other. The beam structure 230b is suspended over the substrate 210 without being directly in contact with the substrate 210 and is connected between the poly-semiconductor patterns 240a and having a plurality of corners A. The carrier tunneling layer 252 compliantly wraps the corners A of the beam structure 230b and the carrier trapping layer 254 compliantly wraps the carrier tunneling layer 252 and the carrier blocking layer 256 compliantly wraps the carrier trapping layer 254. The gate 260 is disposed over the substrate 210 to cover the beam structure 230b and wrap the carrier blocking layer 256.

From the application point of view, the thin film transistor can be used as a nonvolatile memory. Under the circumstance that the corners A is compliantly wrapped by the carrier tunneling layer 252, the carrier trapping layer 254 and the carrier blocking layer 256, the strength of the electric field around each of the corners A in the thin film transistor 200 is relatively high so that the efficiency for implementing the program operation and the erase operation is greatly improved. Moreover, the shape of the beam structure can be precisely controlled by using the photolithography process so that the film layers compliantly wrapping the beam structure 230b can be formed uniformly. Therefore, the electrical performance of each of the thin film transistors 200 is uniform, which is different from the poor electrical performance uniformity of the thin film transistors 100 manufactured by the conventional technique.

According to the aforementioned description, the thin film transistor 200 of the present embodiment can be used as electrical enhanced thin film transistor nonvolatile memory. As for the display technology, the thin film transistor 200 of the present embodiment can be also applied into the system on panel. Since the thin film transistors 200 of the present embodiment can be formed by using the photolithography process, the thin film transistors 200 integrated into the system on panel and the existing thin films on the system on panel can be formed together. Thus, the technique problems such as the difficulty to integrate the processes, the complex process procedure or even the difficulty to control the yield can be overcome.

According to the aforementioned description, the electrical performance of the thin film transistor of the present invention is greatly improved by implementing the specific structure design. Furthermore, the method for forming the thin film transistor of the present invention not only can simplify the complex process procedure of the conventional technique but also can massively produce the thin film transistor with high yield and uniform quality so as to decrease the manufacturing cost.

Although the application has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. A thin film transistor, comprising:
    a substrate;
    an insulating pattern layer, disposed on the substrate;
    a plurality of poly-semiconductor patterns, separated from each other and disposed on the insulating pattern layer;
    at least a beam structure, suspended over the substrate without being directly in contact with the substrate and connected between the poly-semiconductor patterns and having a plurality of corners;
    a carrier tunneling layer, compliantly wrapping the corners of the beam structure;
    a carrier trapping layer, compliantly wrapping the carrier tunneling layer;
    a carrier blocking layer, compliantly wrapping the carrier trapping layer; and
    a gate, disposed over the substrate to cover the beam structure and wrap the carrier blocking layer.

2. The thin film transistor of claim 1, wherein the beam structure has three corners.

3. The thin film transistor of claim 1, further comprising:
    a source and a drain, respectively formed in the poly-semiconductor patterns respectively connected to two ends of the beam structure, wherein the beam structure is connected between the source and the drain.

4. The thin film transistor of claim 1, wherein the material of the insulating pattern layer comprises semiconductor oxide or semiconductor nitride.

5. The thin film transistor of claim 1, wherein the material of the poly-semiconductor patterns comprises polysilicon, poly-germanium or poly-silicon germanium.

6. The thin film transistor of claim 1, wherein the material of the beam structure comprises polysilicon, poly-germanium or poly-silicon germanium.

7. The thin film transistor of claim 1, wherein the material of the gate comprises metal or semiconductor.

* * * * *